United States Patent

Cricchi et al.

[11] 4,099,069
[45] Jul. 4, 1978

[54] CIRCUIT PRODUCING A COMMON CLEAR SIGNAL FOR ERASING SELECTED ARRAYS IN A MNOS MEMORY SYSTEM

[75] Inventors: James R. Cricchi, Baltimore; Joe E. Brewer, Severna Park, both of Md.

[73] Assignee: Westinghouse Electric Corp., Pittsburgh, Pa.

[21] Appl. No.: 730,890

[22] Filed: Oct. 8, 1976

[51] Int. Cl.² ............... G11C 11/40; G11C 8/00; H01L 29/78; H03K 17/30
[52] U.S. Cl. ............................. 307/238; 307/303; 340/184; 357/23; 357/54; 365/233; 365/218
[58] Field of Search ............ 307/238, 270, 303; 357/23, 54; 340/173 R

[56] References Cited

U.S. PATENT DOCUMENTS

| | | | |
|---|---|---|---|
| 3,579,204 | 5/1971 | Lincoln | 307/238 X |
| 3,618,051 | 11/1971 | Oleksiak | 307/238 X |
| 3,691,535 | 9/1972 | Williams | 307/238 X |
| 3,702,990 | 11/1972 | Ross | 340/173 R |
| 3,747,072 | 7/1973 | Lodi et al. | 340/173 R X |
| 3,886,532 | 5/1975 | Wegener et al. | 307/238 X |
| 3,906,461 | 9/1975 | Cappon | 307/238 X |
| 3,925,804 | 12/1975 | Cricchi et al. | 357/54 X |

*Primary Examiner*—Larry N. Anagnos
*Attorney, Agent, or Firm*—C. L. Menzemer

[57] ABSTRACT

An MNOS memory array including circuitry to permit all of the memory devices comprising the array to be addressed for purposes of clearing the array by a block select and a clear signal as disclosed. The circuitry is arranged such that a plurality of arrays may be interconnected to form a large block oriented memory system with all blocks utilizing a common clear signal.

15 Claims, 2 Drawing Figures

CIRCUIT PRODUCING A COMMON CLEAR SIGNAL FOR ERASING SELECTED ARRAYS IN A MNOS MEMORY SYSTEM

STATEMENT OF GOVERNMENT INTEREST

The invention herein described was made in the course of or under a contract or subcontract thereunder, with the U.S. Army Electronics Command, to wit; Contract No. DAAB07-72-C-0236.

BACKGROUND OF THE INVENTION

1. Field of the Invention

The invention relates to digital memories and more particularly to a memory array for use in a block oriented solid state digital memory system in which a common clear signal can be utilized to selectively erase selected arrays of memory elements comprising the system.

2. State of the Prior Art:

Block oriented memory systems utilizing MNOS memory transistors are well known in the prior art. Typical prior art memory systems required the generation of separate block select and clear signals for each block. For example, a system employing 100 blocks required the generation of 100 individual block select and clear signals. While these systems function properly, large amounts of circuitry was required in order to generate the block select and clear signals.

An MNOS transistor is a metal, nitride, oxide, silicon transistor. These memory transistors are extensively described in the prior art literature.

SUMMARY OF THE INVENTION

The subject of this invention is an array of MNOS memory transistors for use in a block oriented memory system which permits selected blocks to be erased in response to a common clear signal and a block select signal. In the preferred embodiment, the memory elements are MNOS memory transistors which are arranged in arrays. Each block may include one or more arrays. Erasing of the data stored in a selected array is accomplished by coupling the gates of all the memory transistors of the system to +5 volts and applying −20 volts to the substrate of the memory transistors to be erased by coupling appropriate signals to circuitry associated with the selected array.

Each array of the system includes memory transistors and circuitry which accepts a clear signal which is common to all arrays comprising the system and a block select signal unique to the array to be cleared. In the preferred embodiment, the arrays comprising the memory systems are constructed as integrated circuits. The MNOS memory transistors comprising each array are constructed on semiconductor island which is isolated from the remainder of the integrated circuit substrate by a PN junction. The clear signal is coupled to the emitter terminal of a PNP transistor. The base and collector of this transistor are connected together and to the island which is the substrate for the memory transistors causing the PNP transistor to function as a diode. Logic circuitry responsive to the block select and clear signals is also coupled to the island which is the substrate for the memory transistors through a second PN junction. The MNOS memory transistors and associated circuitry is arranged such that the island which acts as the substrate of the memory transistors is held at approximately +5 volts except when block select and clear signals are negative at which time the data stored in the addressed array is erased (cleared). This results in a system which has the capability of blocks being selectively cleared and requires a minimum of circuitry to generate the block select and clear signals.

DETAILED DESCRIPTION

Figure 1:
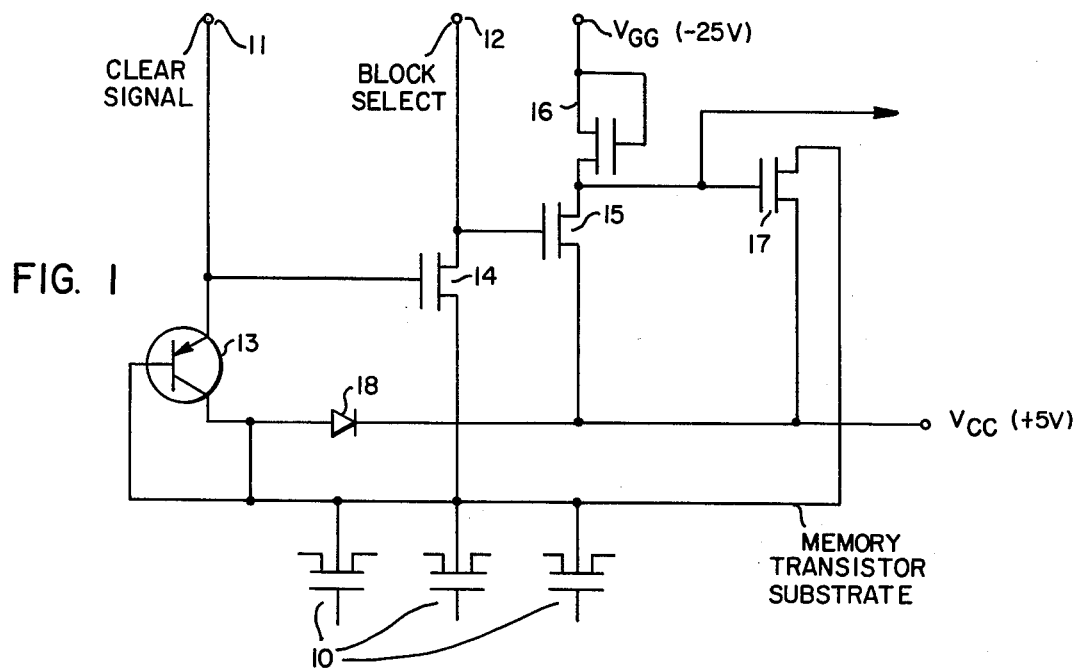
FIG. 1 is a schematic diagram of the MNOS memory array.

FIG. 1 is a schematic diagram of the MNOS memory array which is the subject of this invention. One or more arrays may be utilized as a block of a block oriented memory system. Each array includes a plurality of MNOS memory transistors illustrated generally at reference numeral 10. The memory transistors 10 are not illustrated in detail with respect to the reading and writing circuitry because these functions may be conventionally performed. The basic function of the circuitry, other than the memory transistors 10, associated with each array is to assure that the substrate utilized by the memory transistors 10 is held at a potential of approximately +5 volts for all cycles of the memory system except the clear cycle. During the clear cycle, the circuitry couples the substrate of the memory transistors 10 comprising the array or arrays to be cleared to approximately −20 volts DC with the substrates of the remainder of the memory transistors of the systems being held at approximately +5 volts.

Each of the MNOS memory arrays is controlled for purposes of the clear cycle by two digital signals designated the clear signal and the block select signal. For purposes of simplifying the description of the operation of the array illustrated in FIG. 1, the most negative values of the block select and clear signals are arbitrarily defined as a logic "1" and the most positive level as the logic "0". The logic "1" levels are approximately −25 volts. The logic "0" levels of the block select and clear signals are preferably +5 and +6 volts and are herein referred to for purposes of simplicity as approximately +5 volts DC. The clear and block select signals are respectively coupled to input terminals 11 and 12.

Functionally, the clear signal coupled to terminal 11 is coupled to the substrate of memory devices 10 through a diode 13. In the preferred embodiment of the invention, diode 13 is a PNP transistor with the base of the transistor shorted to the collector as illustrated in FIG. 1. This selection is made largely as a matter of convenience because in the preferred embodiment the array is implemented as an integrated circuit, and this configuration for the diode 13 is particularly convenient.

The block select signal is coupled to input terminal 12, to the drain of an input MOS transistor 14 and to the gate of an amplifier transistor 15. The gate of the input transistor 14 is coupled to the clear signal and the source of this transistor is coupled directly to the substrate of the MNOS memory devices 10. The drain of amplifier transistor 15 is coupled by a load MOS transistor 16 to a −25 volt voltage source. Clamp MOS transistor 17 has its gate terminal coupled to the drain terminal of amplifier transistor 15. The source and drain terminals of this transistor are respectively coupled to a +5 volt voltage source and to the substrate of the MNOS memory devices 10.

A coupling diode 18 couples the substrate of the MNOS memory transistors 10 to the source terminal of transistors 15 and 17 and to the +5 volt voltage source. This results in a circuit in which the substrates for the memory devices 10 is held at +5 volts for all combinations of the clear and block select signals except when both of these signals are a logic "1". When both of the signals are at a logic "1", the substrate for the memory transistors 10 is approximately −20 volts permitting the array to be cleared.

When both the clear and block select signals have a logic "0", the substrate of the memory devices 10 will be held at approximately +5 volts DC. Under these conditions, the clear signal coupled to the input terminal 11 forward biases the combination of coupling diode 13 and isolation diode 18 causing the junction of these two devices and the substrate of the memory devices 10 to be coupled to a DC potential of approximately +5 volts. Amplifier transistor 15 is also turned OFF by the positive block select signal which is coupled to the gate of this transistor. This causes the clamp transistor 17 to be turned ON through the load transistor 16. The low ON resistance of clamp transistor 17 further reduces the voltage drop across the isolation diode 18. The net result of this is that the substrate voltage of the memory transistors 10 is held at approximately +5 volts DC. This prohibits the data stored in memory transistors 10 from being erased.

Assuming that the block clear signal is positive (logic "0") and the block address signal is negative (logic "1") the following conditions will prevail. Amplifier transistor 15 will be turned ON by the negative block select signal coupled to the gate of this transistor. This reduces the voltage to the gate of clamp transistor 17 to a value sufficiently to turn this transistor OFF. However, the positive clear signal forward biases the coupling diode 13 to maintain the voltage at the substrate of memory transistors 10 at approximately +5 volts DC. Thus, under this condition, the state of the memory transistors 10 cannot be changed.

When the clear signal is a logic "1" and the block select signal is a logic "0", the circuit conditions are as follows. Amplifier transistor 15 is turned OFF by the positive block select signal coupled directly to the gate of this transistor. Turning this transistor OFF turns ON the clamp transistor 17 through the load transistor 16. Turning this transistor ON clamps the substrate of the memory transistors 10 to the +5 volts DC supply. Additionally, the negative clear signal reverse biases coupling diode 13 and turns ON input transistor 14. Since the block select signal coupled to the drain of the input transistor 14 has a value of +5 volts DC, turnng ON this transistor aids in the maintaining the substrate of the memory transistors 10 at +5 volts DC. Thus, under these conditions, the state of the memory transistors 10 cannot be changed.

The last combination of the clear and block select signals to be considered is the state when both of the signals are in logic "1". Under these conditions, it is desired to erase any data which is stored in memory transistors 10. As previously discussed, this requires that the substrate of memory devices 10 be held to approximately −20 volts DC. This condition is established as follows.

The −25 volts value of the block select signal is coupled to the gate of amplifier transistor 15 and the drain of input transistor 14. This turns amplifier transistor 15 ON and turns OFF the clamp transistor 17. Additionally, the −25 volts value of the clear signal is coupled to the gate terminal of input transistor 14 turning this transistor ON. Turning ON the input transistor 14 couples the −25 volt block select signal, coupled to the drain of this transistor, to the substrate of the memory transistors 10 causing the substrate voltage to be approximately −20 volts DC. Input diode 13 is reverse biased because the clear signal which is approximately −25 volts while the substrate of the memory transistors 10 is approximately −20 volts. As previously discussed, during the clear cycle the gate terminals of all the memory transistors 10 are coupled to a signal of approximately +5 volts DC. This results in the voltage between the gate and substrate of memory transistors 10 being approximately −25 volts. This value of voltage is more than sufficient to erase any information which is stored in any of the addressed memory transistors 10.

Figure 2:
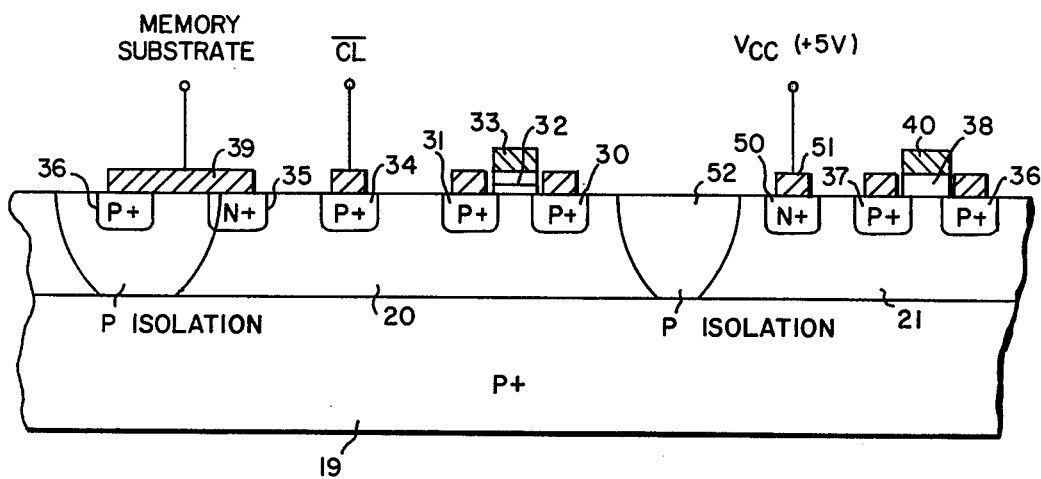
FIG. 2 is a cross-section of a simplified integrated circuit implementation of the MNOS memory array.

The circuits illustrated in FIG. 1 is preferably implemented as an integrated circuit. FIG. 2 illustrates in cross section a portion of a simplified integrated circuit to show how the various components utilized by the circuit illustrated in FIG. 1 can be conveniently implemented in integrated circuit form.

The circuit illustrated in cross section in FIG. 2 includes a P+ integrated circuit substrate 19. On the upper surface of the P conductivity type substrate 19 a thin N-type epitaxial layer is formed. P type dopants are diffused into the surface of an epitaxial layer to form two islands 20 and 21 of N conductivity type material. A first island 20 is utilized as a substrate to construct the array of MNOS memory transistors 10 as well as the portion of the isolation diode 13. Similarly, island 21 is utilized as a substrate to construct MOS transistors 14, 15, 16 and 17. The N conductivity type islands 20 and 21, can be formed using well known semiconductor processes.

A P+ region 30 is first diffused into the N conductivity type island 20 to form the source of a typical MNOS memory transistor. Simultaneously with the diffusion of the source region 30, a second P+ region 31 which acts as the drain of the memory transistor is also diffused. The region of the N island 20 between the source 30 and the drain 31 acts as the channel of the memory device. Overlying the channel region of the memory transistor is a dual layer gate insulator 32 and a gate 33. The memory transistor may be of any conventional design and a plurality of these transistors may be constructed within the N conductivity type island 20 to form an array of memory elements as is well known in the prior art. For this reason the detailed design of the array of memory transistors will not be discussed in detail.

Isolation diode 13 as illustrated in FIG. 1 is actually a PNP transistor with the base shorted to the collector. Such a structure is conveniently formed by diffusing a P+ conductivity type emitter 34 into the upper surface of the N conductivity type island 20. This P+ conductivity type region does not extend entirely through the N conductivity type island 20. The region of the N conductivity type island 20 between the P+ emitter region 34 and the P conductivity type substrate 19 acts as the base of the transistor with the P conductivity type integrated circuit substrate 19 forming the collector. This results in a vertical PNP transistor.

As shown in FIG. 1, it is necessary to short the base of the PNP transistor to the collector to form the isolation diodes 13. This is conveniently accomplished by diffusing an N+ area 35 into the upper surface of the N conductivity type island 20. This region makes ohmic contact to the N conductivity type island 20. Additionally, a P+ conductivity type region 36 is diffused into the P region which isolates the N conductivity type island 20 from the remainder of the circuit. A low electrical resistance contact is established between the N+ region 35 and the P+ region 36 by forming a layer 39 of high conductivity material such as aluminum on the upper surface such that it is an low electrical resistance contact with both of these regions. This electrically shorts the base of the vertical PNP transistor to the collector to form isolation diode 13 as illustrated in FIG. 1.

As previously discussed, the N conductivity type island 21 is utilized to construct MOS transistors 14, 15, 16 and 17. A typical transistor is illustrated in FIG. 2. The remainder of the non-memory transistors as well as the inner connnections necessary to complete the circuit have been eliminated for purposes of simplicity.

A typical transistor includes a P+ source region 36 and a P+ drain region 37. The portion of the N conductivity type island 21 between the source 36 and the drain 37 is the channel of transistor. Overlying the channel is a gate insulator 38 and a gate 40. A high conductivity N+ region 50 is also formed in the N conductivity type island 21. A metallic contact 51 is made to this region and coupled to a +5 volt voltage source. This biases the N conductivity type island 21 which is used as a substrate for constructing nonmemory transistors approximately +5 volts DC.

The N conductivity type island 21 forms a PN junction with the P substrate 19 and the P isolation region 52. This junction is shown in FIG. 1 as reference numeral 18 and referred to as the isolation diode discussing FIG. 1.

FIG. 2 discussed above illustrates how the coupling diode 13, the MNOS memory transistors 10 and a typical MOS transistor useful in the circuit can be implemented as an integrated circuit. The integrated circuit discussed in FIG. 2 can be expanded to include in a number of MNOS memory transistors 10 and the required number of MOS transistors to perform the logic function. Once the required number of transistors are formed, they can be interconnected using standard interconnect technology to construct the required circuits. All of this is believed to be well within the skill of the art and therefore is not shown in detail in FIG. 2.

Although the non-memory transistors have been discussed as MOS devices they may be MNOS devices utilizing a gate oxide having a thickness greater than a charge tunneling thickness.

From the above discussion, it is clear that any number of the arrays illustrated in FIG. 1 can be combined to form a large block oriented memory system. A common clear signal can be coupled to all of the arrays comprising the system and individual block address signal supplied by addressing logic (not illustrated) to the block to be cleared. This substantially reduces the logic associated with the clear cycle as compared to prior art systems in which it was necessary to generate a separate clear signal for each block of the array. The circuits associated with reading and writing cycles may be of conventional prior art design.

We claim:
1. An integrated circuit comprising:
 a. first and second semiconductor islands isolated from each other by a PN junction and supported by a common substrate,
 b. a plurality of memory transistors utilizing said first semiconductor island as a substrate,
 c. a logic circuit having first and second logic inputs and a logic output, said logic output operatively coupled to the substrate of said memory transistors for applying thereto a first potential in response to first, second, and third preselected permutations of first and second logic signals applied to said logic inputs, and a second potential in response to a fourth preselected permutation of said first and second logic signals applied to said inputs, and including a plurality of semiconductor devices utilizing said second semiconductor island as a substrate, said devices including:
  (1) a first coupling diode for coupling said first logic input and said logic output,
  (2) a first switch means operatively coupled between said second logic input and said logic output for operating in response to logic signals, applied to said first logic input,
  (3) second switch means operatively coupled to said first potential for operating in response to logic signals applied to said second logic input,
  (4) load means coupled between said second switch means and a third potential for providing an impedance across which a potential is developed,
  (5) third switch means coupled to said first potential for opening and closing in response to the opening and closing of said second switch means,
  (6) a second coupling diode for coupling said first potential and said logic output.

2. An integrated circuit in accordance with claim 1 wherein said PN junction comprises the junction formed by said first and second semiconductor islands with said common substrate.

3. An integrated circuit in accordance with claim 1 wherein said common substrate is a P conductivity type semiconductor.

4. An integrated circuit in accordance with claim 1 wherein at least one of said first and second signals is coupled to said first semiconductor island through a PN junction.

5. An integrated circuit in accordance with claim 4 wherein said PN junction comprises a bipolar transistor with the base and collector of said bipolar transistor connected together.

6. An integrated circuit in accordance with claim 5 wherein the emitter of said bipolar transistor comprises a P conductivity type region within said first semiconductor island.

7. An integrated circuit in accordance with claim 6 wherein the base of said bipolar transistor comprises a region of said first semiconductor island beneath said P conductivity type region.

8. An integrated circuit in accordance with claim 7 wherein the collector of said bipolar transistor comprises said common substrate.

9. An integrated circuit in accordance with claim 8 further including contact means for biasing said second semiconductor island to a substantially constant voltage potential.

10. An integrated circuit in accordance with claim 9 wherein said memory transistors are MNOS transistors.

11. An integrated circuit in accordance with claim 1 wherein said first coupling diode includes a transistor, a base and collector of which are coupled together.

12. An integrated circuit in accordance with claim 1 wherein said first switch means includes a transistor.

13. An integrated circuit in accordance with claim 1 wherein said second switch means includes a transistor.

14. An integrated circuit in accordance with claim 1 wherein said load means includes a transistor having a gate, source and drain, the gate and source of which are coupled together.

15. An integrated circuit in accordance with claim 1 wherein said third switch means includes a transistor.

* * * * *